(12) United States Patent
Fujimoto et al.

(10) Patent No.: US 9,780,523 B2
(45) Date of Patent: Oct. 3, 2017

(54) SEMICONDUCTOR LASER DEVICE

(71) Applicant: Nichia Corporation, Anan-shi, Tokushima (JP)

(72) Inventors: Hideyuki Fujimoto, Anan (JP); Masatoshi Nakagaki, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/982,883

(22) Filed: Dec. 29, 2015

(65) Prior Publication Data
US 2016/0111854 A1   Apr. 21, 2016

Related U.S. Application Data

(63) Continuation of application No. 13/840,004, filed on Mar. 15, 2013.

(30) Foreign Application Priority Data

Mar. 22, 2012 (JP) ................................ 2012-065081
Jan. 22, 2013 (JP) ................................ 2013-009484

(51) Int. Cl.
*H01S 5/022* (2006.01)
*H01S 5/024* (2006.01)
(Continued)

(52) U.S. Cl.
CPC .......... *H01S 5/02272* (2013.01); *H01L 24/27* (2013.01); *H01L 24/31* (2013.01);
(Continued)

(58) Field of Classification Search
CPC ........ H01L 33/62; H01L 33/64–33/644; H01L 33/647; H01L 2224/321–2224/32268;
(Continued)

(56) References Cited

U.S. PATENT DOCUMENTS 5,357,536 A * 10/1994 Andrews ............... H01S 5/0224
372/107
5,486,719 A * 1/1996 Sugiura ............... H01L 23/5283
257/437

(Continued)

FOREIGN PATENT DOCUMENTS

JP   H05-190973 A   7/1993
JP   H09-172224 A   6/1997
(Continued)

*Primary Examiner* — Xinning Niu
*Assistant Examiner* — Sean Hagan
(74) *Attorney, Agent, or Firm* — Foley & Lardner LLP

(57) ABSTRACT

A semiconductor laser device comprises a base, a first conductive layer, a second conductive layer, a third conductive layer, and a semiconductor laser chip in this order, each of which has a respective emitting-side end portion. The emitting-side end portion of the first conductive layer is in a common plane with the emitting-side end portion of the base. A thickness of the second conductive layer is greater than a thickness of the first conductive layer. The emitting-side end portion of the second conductive layer is disposed inward of the emitting-end portion of the first conductive layer. The emitting-side end portion of the third conductive layer is in a common plane with the emitting-side end portion of the second conductive layer. The emitting-side end portion of the semiconductor laser chip is disposed outward of the emitting-side end portion of the third conductive layer.

19 Claims, 5 Drawing Sheets

(51) Int. Cl.
*H01S 5/323* (2006.01)
*H01L 23/00* (2006.01)

(52) U.S. Cl.
CPC .......... *H01S 5/024* (2013.01); *H01S 5/02236* (2013.01); *H01S 5/02268* (2013.01); *H01S 5/02469* (2013.01); *H01S 5/32341* (2013.01); *H01L 2224/27005* (2013.01); *H01L 2224/32113* (2013.01); *H01L 2224/48091* (2013.01); *H01S 5/02476* (2013.01)

(58) Field of Classification Search
CPC ............ H01L 2224/27001–2224/27019; H01L 2224/2747–2224/2748; H01S 5/0224; H01S 5/02212; H01S 5/02236–5/02244; H01S 5/02256; H01S 5/02268; H01S 5/02272; H01S 5/024; H01S 5/02469; H01S 5/02476
See application file for complete search history.

(56) References Cited

U.S. PATENT DOCUMENTS

| | | | |
|---|---|---|---|
| 5,627,851 A | 5/1997 | Takahashi | |
| 6,349,104 B1 | 2/2002 | Kato et al. | |
| 6,796,480 B1 | 9/2004 | Powers et al. | |
| 7,508,854 B2 | 3/2009 | Honda | |
| 7,522,649 B2 | 4/2009 | Ha et al. | |
| 2001/0048705 A1* | 12/2001 | Kitaoka | G02B 6/12004 372/50.11 |
| 2004/0209406 A1* | 10/2004 | Jan | H01L 24/11 438/148 |
| 2005/0067636 A1* | 3/2005 | Amoh | H01S 5/02272 257/232 |
| 2005/0079716 A1* | 4/2005 | Yoshihara | H01S 5/02248 438/689 |
| 2005/0167679 A1 | 8/2005 | Ishii et al. | |
| 2006/0249745 A1 | 11/2006 | Chae et al. | |
| 2008/0310471 A1 | 12/2008 | Bessho et al. | |
| 2009/0022197 A1* | 1/2009 | Hisa | H01S 5/4031 372/46.01 |

FOREIGN PATENT DOCUMENTS

| | | |
|---|---|---|
| JP | 2002-368020 A | 12/2002 |
| JP | 2007-134744 A | 5/2007 |
| JP | 2008-034581 A | 2/2008 |
| JP | 2008-085272 A | 4/2008 |

* cited by examiner

SEMICONDUCTOR LASER DEVICE

CROSS-REFERENCE TO RELATED APPLICATIONS

The present application is a Continuation of U.S. patent application Ser. No. 13/840,004, filed Mar. 15, 2013, and claims priority under 35 U. S. C. §119 to Japanese Patent Application No. 2012-065081, filed Mar. 22, 2012, and Japanese Patent Application No. 2013-9484, filed Jan. 22, 2013. The contents of these applications are incorporated herein by reference in their entireties.

BACKGROUND OF THE INVENTION

Field of the Invention

The present disclosure relates to a semiconductor laser device.

Description of the Related Art

Conventionally, a semiconductor laser device having a "submount base 1," a "AuSn layer 5b," and a "semiconductor laser chip 6," in this order, is known (JP H9-172224A). In the semiconductor laser device described in this reference, respective end portions of the base and the third conductive layer are arranged in a common plane.

SUMMARY OF THE INVENTION

A semiconductor laser device according to an embodiment of the present invention includes a base, a first conductive layer, a second conductive layer, a third conductive layer, and a semiconductor laser chip in this order, each of which respectively has an emitting-side end portion and a reflecting-side end portion. The first conductive layer has its emitting-side end portion arranged in a common plane with the emitting end portion of the base, and has an external connection region for electrically connecting to outside. The second conductive layer is formed on the first conductive layer in a region different from the external connection region of the first conductive layer, with a thickness greater than that of the first conductive layer, and also with the emitting-side end portion of the second conductive layer located at an inner side than the emitting-side end portion of the first conductive layer. The third conductive layer is formed so that its emitting-side end portion is in a common plane with the emitting-side end portion of the second conductive layer. Further, the semiconductor chip is disposed so that its emitting-side end portion is located outer side than the emitting-side end portion of the third conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
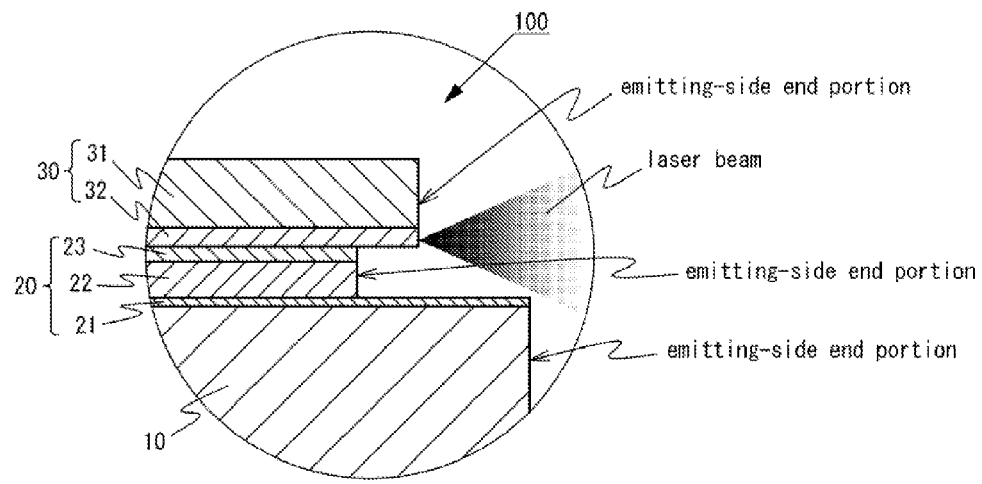
FIG. 1 is a cross-sectional view in the vicinity of emitting-side end portion of the base of a semiconductor laser device according to an embodiment of the invention.

Embodiments of the present invention will be described below with reference to the drawings. The embodiments are intended as illustrative of a light emitting device to give a concrete form to technical ideas of the present invention, and the scope of the invention is not limited to those described below. The sizes and the arrangement relationships of the members in each of drawings are occasionally shown exaggerated for ease of explanation. The embodiments will now be described with reference to the accompanying drawings, wherein like reference numerals designate corresponding or identical elements throughout the various drawings.

Figure 2A:
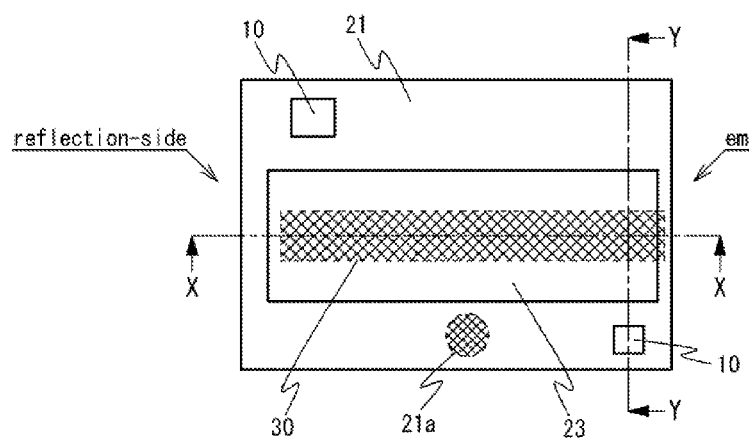
FIG. 2A is a plan view viewed from above of the semiconductor laser device 100 in FIG. 1 (for reference, the arranging region of the semiconductor laser chip 30 is shown shaded in FIG. 2A).
Figure 2C:
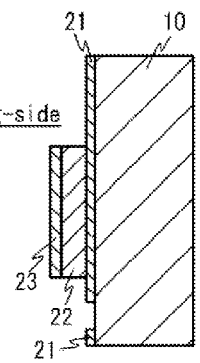
FIG. 2C is a cross-sectional view taken along line Y-Y of FIG. 2A.
Figure 2B:
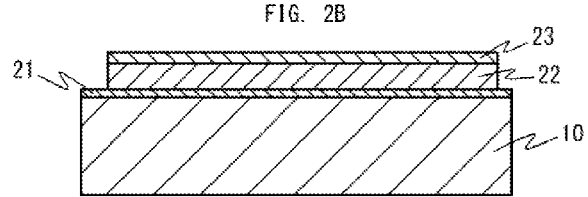
FIG. 2B is a cross-sectional view taken along line X-X of FIG. 2A.
Figure 3:
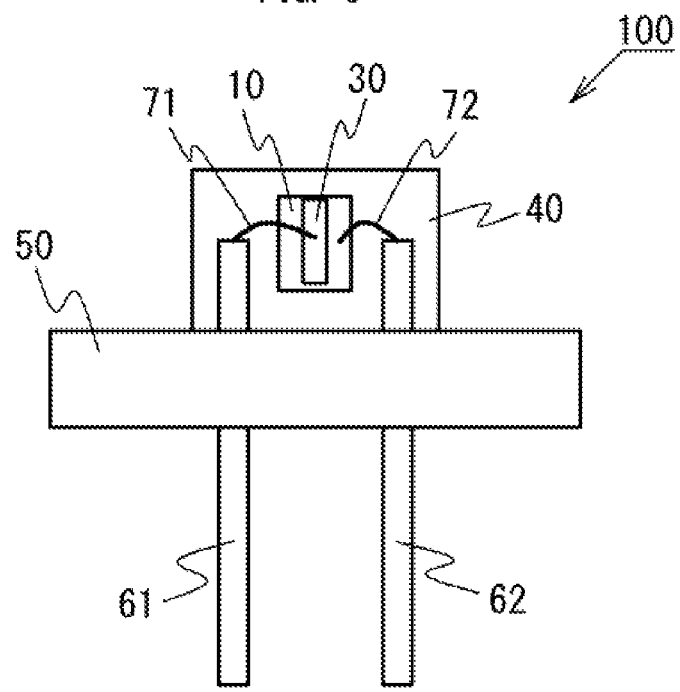
FIG. 3 is a diagram for illustrating an entire configuration of a semiconductor laser device according to an embodiment of the invention.

FIG. 1 is a cross-sectional view in the vicinity of an emitting-side end portion of a base 10 in a semiconductor laser device 100 according to the present embodiment, FIG. 2A, FIG. 2B, and FIG. 2C are diagrams each illustrating the base 10 of the semiconductor laser device 100, and FIG. 3 is an appearance diagram of the semiconductor laser device 100, respectively. For the simplicity of explanation, the semiconductor laser chip 30 is not shown in FIG. 2A, FIG. 2B, and FIG. 2C. Further, in FIG. 3, the conductive layer 20 is omitted.

As shown in each figure, the semiconductor laser device 100 includes, a base 10, a first conductive layer, 21 a second conductive layer 22, a third conductive layer 23, and a semiconductor laser chip 30 in this order, each of which respectively has an emitting-side end portion and a reflecting-side end portion. The first conductive layer 21 has its emitting-side end portion arranged in a common plane with the emitting-side end portion of the base 10, and has an external connection region 21a for electrically connecting to outside. The second conductive layer 22 is formed in a different region from the external connection region 21a of the first conductive layer, with a thickness greater than that of the first conductive layer 21. Also, the emitting-side end portion of the second conductive layer is located inward of the emitting-side end portion of the first conductive layer 21. The third conductive layer 23 is formed so that its emitting-side end portion is in a common plane with the emitting-side end portion of the second conductive layer 22. Further, the semiconductor chip 30 is disposed so that its emitting-side end portion is located outward from the emitting-side end portion of the third conductive layer 23.

With this arrangement, a semiconductor laser device capable of emitting a laser beam with good far field pattern (hereinafter may be referred to as "FFP") and having a good heat dissipating property can be obtained This feature will be described in detail below.

In general, a semiconductor laser chip is mounted on a base (so-called "sub-mount") via a first conductive layer which will be connected to a wire, and a third conductive layer (a brazing material such as a solder) which is disposed on a part of the first conductive layer and will be directly connected to the semiconductor laser chip. At this time, in some cases, the emitting-side end portion of the third conductive layer is disposed to the emitting-side end portion of the base, and also, the emitting-side end portion of the semiconductor laser chip is arranged in a common plane or protrudes from the emitting-side end portion of the third conductive layer. This is because forming the third conductive layer arranged directly under the semiconductor laser chip as big as possible enables improvement of heat dissipation. Also, arranging the emitting-side end portion of the semiconductor laser chip in a common plane or protruding with respect to corresponding portion of the base enables prevention of shape anomaly in the FFP caused by the laser beam hitting the surface of the base.

However, in order to arrange respective emitting-side end portions of the base and the third conductive layer in a common plane, the wafer having the third conductive layer disposed thereon must be divided along with the third conductive layer to obtain individual bases. At this time, because of a relatively great thickness of the third conductive layer to which the semiconductor laser chip will be directly bonded, one or more large burrs are apt to be generated in the third conductive layer (for example, burrs occur in a longitudinal direction or in a lateral direction in FIG. 1). Generation of one or more burrs in the third conductive layer may lead the third conductive layer to creep up to the emitting end portion of the semiconductor laser chip, which blocks the light emitting portion, resulting in a problem of a degradation of the FFP. Further, a variation in mounting accuracy occurs due to the burrs, so that accurate control of the positional relationship between the emitting-side end portion of the semiconductor laser chip and the emitting-side end portion of the base becomes difficult. For this reason, an attempt to arrange the emitting-side end portions of the semiconductor laser chip and the base in a common plane may lead to a configuration in which the emitting-side end portion of the semiconductor laser chip is located at an inner side than the emitting-side end portion of the base, which then leads to a degradation of the FFP. Conversely, in some cases the emitting-side end portion of the semiconductor laser chip is excessively protruded than the base. In those cases, although the FFP is not affected, problems may arise from a decrease in heat dissipation which leads to a reduction in operating life and occurrence of catastrophic optical damage.

Therefore, in the present embodiment, the emitting-side end portion of the third conductive layer 23 having a relatively large thickness is spaced apart from the emitting-side end portion of the base 10 (that is, the emitting-side end portion of the third conductive layer 23 is arranged inward of the emitting-side end portion of the base 10). With this arrangement, a degradation of the FFP and occurrence of variation in mounting accuracy due to burrs in the third conductive layer 23 generated at the time of dividing wafer can be eliminated. Also, generally, the third conductive layer 23 is disposed on a part of the first conductive layer 21, which prevents precise conformation of the respective emitting-side end portions of the first conductive layer 21 and the third conductive layer 23 in a common plane. For this reason, the first conductive layer 21 is inevitably formed with a larger size (the two layers are disposed by using a mask in different steps, so that the end portions are impossible to be precisely arranged in a common plane). Therefore, with a consideration of FFP, an attempt of dividing a wafer at a position proximate possible to the emitting-side end portion of the third conductive layer 23 inevitably results in dividing of the first conductive layer 21. However, contrary to the above, according to the present embodiment, the first conductive layer 21 has a relatively small thickness, so that dividing of a wafer at a location where the first conductive layer 21 exists does not results in generation of large burrs. Also, between the first conductive layer 21 and the third conductive layer 23, a second conductive layer having a thickness larger than that of the first conductive layer 21 and whose emitting-side end portion is in a common plane with that of the third conductive layer 23 is disposed. With this arrangement, even if burrs occur in the first conductive layer 21, there is a low possibility that the burrs in the first conductive layer 21 reach a location higher than the second conductive layer 22. In this case, respective emitting-side end portions of the second conductive layer 22 and the third conductive portion 23 are in a common plane in precise conformity, so that as long as the semiconductor laser chip 30 is protruded than the third conductive layer 23, the laser beam will not be blocked by the second conductive layer 22. Further, due to the presence of the second conductive layer 22, the semiconductor laser chip 30 is spaced apart from the first conductive layer 21, and therefore the effect on the FFP can be reduced. Thus, the emitting-side end portion of the semiconductor laser chip 30 can be provided inward of the emitting-side end portion of the base 10, so that its heat dissipating property can also be improved, and a margin in the mounting accuracy can be also improved. As described above, with the semiconductor laser device 100, the heat dissipating property can be improved while improving the FFP.

Figure 6:
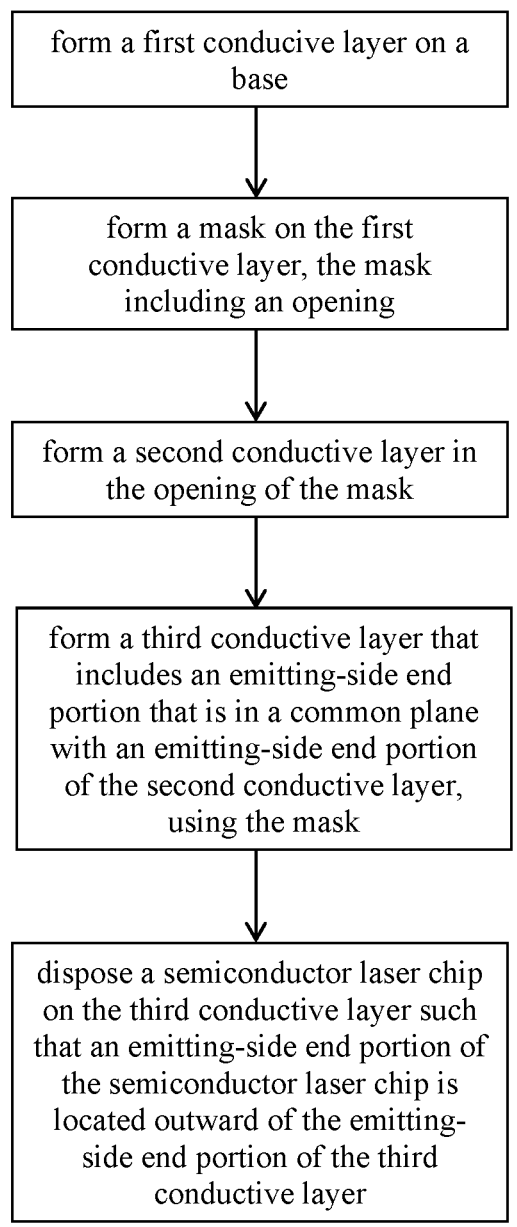
FIG. 6 is a flow chart showing the steps of a method for manufacturing a semiconductor laser device according to one embodiment of the invention.

FIG. 6 is a flow chart showing the steps of a method for manufacturing a semiconductor laser device according to one embodiment of the invention.

The main components of the semiconductor laser device 100 will be described below.

(Base 10)

The base 10 is a member which is also called as a "submount," and is used for mounting a semiconductor laser chip 30. For the base 10, a material having good heat dissipating property such as aluminum nitride, silicon carbide, silicon, and diamond can be used.

For the base 10 illustrated in FIG. 1 etc., an insulating material is used. Therefore, a conductive layer 20 is formed on the base 10 to achieve electric connection between the semiconductor laser chip 30 and outside.

(Conductive Layer 20)

As shown in FIG. 0.1, the conductive layer 20 has, in order from the base 10 side, a first conductive layer 21, a second conductive layer 22, and a third conductive layer 23. The conductive layer 20 serves to electrically connect the semiconductor laser chip 30 and outside, while mechanically fixing the semiconductor laser chip 30 on the base 10. Note that the first conductive layer 21, the second conductive layer 22, and the third conductive layer 23 which constitute the conductive layer 20 may be respectively made with a single layer or with a plurality of layers.

The first conductive layer 21 is a layer closest to the base 10 and in the present embodiment as shown in FIG. 2A, FIG. 2B, and FIG. 2C, is disposed on approximately the entire surface of the upper surface of the base 10. As shown in FIG. 2A, the first conductive layer 21 has an external connection region 21a for electrically connecting to outside. Also, as shown in FIG. 3, a wire 72 is later connected to the external connection region 21*a* shown in FIG. 2A, so that one of the electrodes of the semiconductor laser chip 30 and the lead 62 are electrically connected by the wire 72.

The emitting-side end portion of the first conductive layer 21 is in a common surface with the emitting-side end portion of the base 10, so that burrs may occur in the first conductive layer 21. However, even if burrs are generated in the first conductive layer 21, the second conductive layer 22 having a thickness greater than that of the first conductive layer 21 has been provided on the first conductive layer 21, so that the burrs in the first conductive layer 21 have substantially no effect on the FFP.

The thickness of the first conductive layer 21 may be preferably 0.1 μm or greater and 2.5 μm or less, more preferably 0.2 μm or greater and 2.0 μm or less, and further preferably 0.5 μm or greater and 1.5 μm or less. This is because, with a thickness above a certain value, sufficient strength for connecting a wire 72 can be secured, and meanwhile, with a thickness below a certain value, generation of burrs can be prevented.

As shown in FIG. 2A, FIG. 2B and FIG. 2C, the second conductive layer 22 and the third conductive layer 23 are formed on the first conductive layer in the region other than the external connection region 21*a*. The second conductive layer 22 is formed with a thickness greater than that of the first conductive layer 21, and the emitting-side end portion of the second conductive layer 22 is spaced apart from the emitting-side end portion of the first conductive layer 21 (that is, it is arranged inward of the emitting-side end portion of the first conductive layer 21).

The second conductive layer 22 is provided to increase the distance between the base 10 and the semiconductor laser chip 30, and therefore, the second conductive layer 22 is formed with a relatively large thickness. The second conductive layer 22 is formed with a thickness which is at least larger than the thickness of the first conductive layer 21. This is because even if burrs are generated in the emitting-side end portion of the first conductive layer 21, the effect of the burr on the FFP can be reduced. Note that, even if the thickness of the second conductive layer 22 is increased, the emitting-side end portion of the second conductive layer 22 is spaced apart from the emitting-side end portion of the first conductive layer 21 (i.e., located at an inner side), so that burrs will not occur in the second conductive layer 22 at the time of dividing a wafer.

The second conductive layer 22 has a relatively large thickness, and is therefore preferably made of a material having excellent heat dissipating property. Particularly, smoother heat dissipation from the semiconductor laser chip 30 to the base 10 can be expected by forming the second conductive layer 22 with a material having a thermal conductivity greater than that of the base 10. Particularly, as shown in FIG. 2A, in a plan view, employing a planar dimension of the second conductive layer 22 greater than the planar dimension of the semiconductor laser chip 30 allows dissipation of the heat from the semiconductor laser chip 30 in the planar direction, and is thus preferable. For the second conductive layer 22, a material which contains at least one of gold, copper, and silver may be employed.

The distance from the emitting-side end portion of the first conductive layer 21 to the emitting-side end portion of the second conductive layer 22 may be preferably 1 μm or greater and 100 μm or less, more preferably 1 μm or greater and 50 μm or less, and further preferably 1 μm or greater and 20 μm or less. This is because, a distance above a certain value enables prevention of generation of burrs due to a cleaving portion reaching the second conductive layer 22 caused by a variation in the accuracy at the time of dividing a wafer, and at the same time, a distance below a certain value enables improvement of FFP and heat dissipating property.

The thickness of the first conductive layer 22 may be preferably 2 μm or greater and 50 μm or less, more preferably 3 μm or greater and 25 μm or less, and further preferably 4 μm or greater and 20 μm or less. This is because, a thickness above a certain value enables prevention of light emitted by the semiconductor laser chip 30 from hitting the upper surface of the base 10, and at the same time, a thickness below a certain value enables improvement of mass productivity.

The third conductive layer 23 is a layer which is directly in contact with the semiconductor laser chip 30, and is made with a brazing material such as AuSn solder. The third conductive layer 23 preferably has a thickness less than that of the second conductive layer 22 (that is, the second conductive layer 22 has a thickness larger than the thickness of the third conductive layer 23). This is because the third conductive layer 23 is softened by heat at the time of mounting, and thus an excessive thickness may cause tilting of the semiconductor laser chip 30 or the third conductive layer 23 to creep up the side surfaces of the semiconductor laser chip 30 which may lead to current leak.

Figure 7:
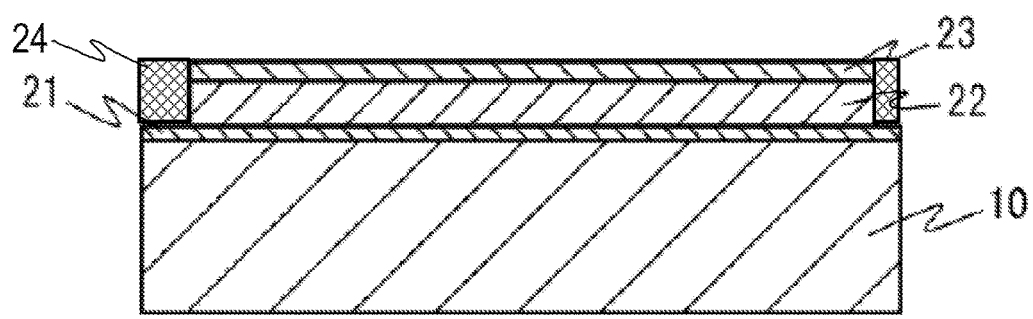
FIG. 7 is a cross-sectional view of the semiconductor laser device shown in FIGS. 1 and 2A-2C, taken along line X-X of FIG. 2A, shown along with a mask used to form second and third conductive layers.

In order to dispose the emitting-side end portion of the third conductive layer 23 and the emitting-side end portion of the second conductive layer 22 in a common plane, for example, after disposing the first conductive layer 21 on the base 10, using a mask 24 having openings of a predetermined shape, the second conductive layer 22 and the third conductive layer 23 are successively disposed by way of sputtering. A common mask 24 is used when disposing those layers, as shown in FIG. 7, so that the shapes of the second conductive layer 22 and the third conductive layer 23 can be perfectly matched and the side surfaces of the both layers can be arranged in a common plane.

The thickness of the third conductive layer 23 may be preferably 1 μm or greater and 10 μm or less, more preferably 1.5 μm or greater and 10 μm or less, and further preferably 2 μm or greater and 5 μm or less. This is because, a thickness above a certain value enables secure connection with the semiconductor laser chip 30, and at the same time, a thickness below a certain value enables prevention of leak current or the like.

(Semiconductor Laser Chip 30)

For the semiconductor laser chip 30, a known semiconductor laser chip can be used and, for example, a semiconductor laser chip made of a nitride semiconductor can be used. As shown in FIG. 1, in the present embodiment, the semiconductor laser chip 30 includes a substrate 31 and a semiconductor structure 32. In the case where the semiconductor laser chip 30 is made of a nitride semiconductor, an n-type GaN substrate is often used for the substrate 31. The semiconductor structure 32 includes an n-type layer, an active layer a p-type layer, etc. In FIG. 1, an n-electrode disposed on the upper surface of the semiconductor laser chip 30 and a p-electrode disposed on the lower surface of the semiconductor laser chip 30 are not shown.

As shown in FIG. 1, in the case where the semiconductor laser chip 30 includes the substrate 31 and the semiconductor structure 32, the third conductive layer 23 is preferably connected to the semiconductor laser chip 30 at the semiconductor structure side 32 (i.e. face-down mounting). In the case of face-down mounting, the semiconductor structure (to be precise, the optical waveguide in the semiconductor structure) which is the main source of heat generation can be disposed close to the base 10, so that it is advantageous in terms of heat dissipation. On the other hand, since the emitting portion of the semiconductor laser chip 30 becomes close to the third conductive layer 23, the laser beams apt to hit the upper surface of the base 10, resulting in a degradation of the FFP. Therefore, in the present invention capable of suppressing degradation of the FFP and heat dissipation, face-down mounting of the semiconductor laser chip 30 is preferable as it can facilitate the effects of the FFP and heat dissipation.

(Heat Sink 40)

The heat sink 40 is also called as a "stem 50" and is provided to mount the base 10. Also, heat generated in the semiconductor laser chip 30 is transferred to the heat sink 40 via the base 10. For this reason, a metal material having good heat dissipating property such as copper is often used for the heat sink 40. As shown in FIG. 3, on the heat sink 40 (facing toward the viewer in FIG. 3), the base 10 and the semiconductor laser chip 30 are disposed in this order.

(Stem 50)

The stem 50 is also called an eyelet and the heat sink 40 is fixed upwardly (in the upper direction in FIG. 3) on the stem 50. Generally, a metal material such as iron having lower heat dissipation than that of the heat sink 40 is used for the stem 50. This may be because, a cap (not shown) for hermetically sealing is needed to connect to the stem 50 by welding or the like in a later step of the procedure, and if the stem 50 has a thermal conductivity that is too high, the heat will be dissipated and the welding cannot be performed.

(Lead Terminal 61, 62)

As shown in FIG. 3, the semiconductor laser device 100 is provided with lead terminals 61, 62 for supplying electricity to the semiconductor laser chip 30. In this embodiment, the lead terminals 61, 62 are respectively disposed so as to penetrate the stem 50 in the up-and-down direction of the stem 50. Each lead terminal is respectively fixed to the stem 50 via an insulating material. The lead terminal 61 is electrically connected to the upper surface side of the semiconductor laser chip 30 via the wire 71. The lead terminal 62 is electrically connected to the lower surface side of the semiconductor laser chip 30 via the wire 72.

EXAMPLE

The semiconductor laser device 100 was fabricated by using the base 10 made of aluminum nitride (polycrystal), the first conductive layer 21 made of Ti/Pt/Au (Ti is at the base 10 side), the second conductive layer 22 made of Au, a diffusion preventing layer made of Pt (not shown), the third conductive layer 23 made of AuSn eutectic alloy, the semiconductor laser chip 30 made of a nitride semiconductor and having an oscillation wavelength of 445 nm, the heat sink 40 containing copper as its main component, and the stem 50 containing iron as its main component.

The semiconductor laser chip 30 has the GaN substrate 31 and the semiconductor structure 32 which includes a plurality of nitride semiconductor layers. The lower surface side (upper side in FIG. 1) of the GaN substrate 31 is provided with an n-electrode (not shown) and the upper surface side (lower side in FIG. 1) of the semiconductor structure 32 is provided with a p-electrode (not shown). As shown in FIG. 3, using the wire 71, the n-electrode of the semiconductor laser chip 30 and the lead terminal 61 were electrically connected. Also, using the wire 72, the p-electrode of the semiconductor laser chip 30 and the lead terminal 62 were electrically connected.

The base 10 is 1300 μm×800 μm (size in height and width illustrated in FIG. 2; the same as those below), the second conductive layer 22 is 1250 μm×350 μm, and the semiconductor laser chip 30 is 1200 μm×150 μm. For the sake of design, the distance between the emitting-side end portion of the first conductive layer 21 and the emitting-side end portion of the second conductive layer 22 was 10 μm and the distance between the emitting-side end portion of the first conductive layer 21 and the emitting-side end portion of the semiconductor laser chip 30 which is located at an inner side than the emitting-side end portion of the first conductive layer 21 was 5 μm. Also, in the same manner, the thickness of the first conductive layer 21 was 0.8 μm, the thickness of the second conductive layer 22 was 5 μm, and the third conductive layer 23 was 3 μm.

Comparative Example

A semiconductor laser device for the Comparative Example was fabricated in a similar manner as in Example 1, except that the second conductive layer 22 was not formed.

Evaluation

Figure 4:
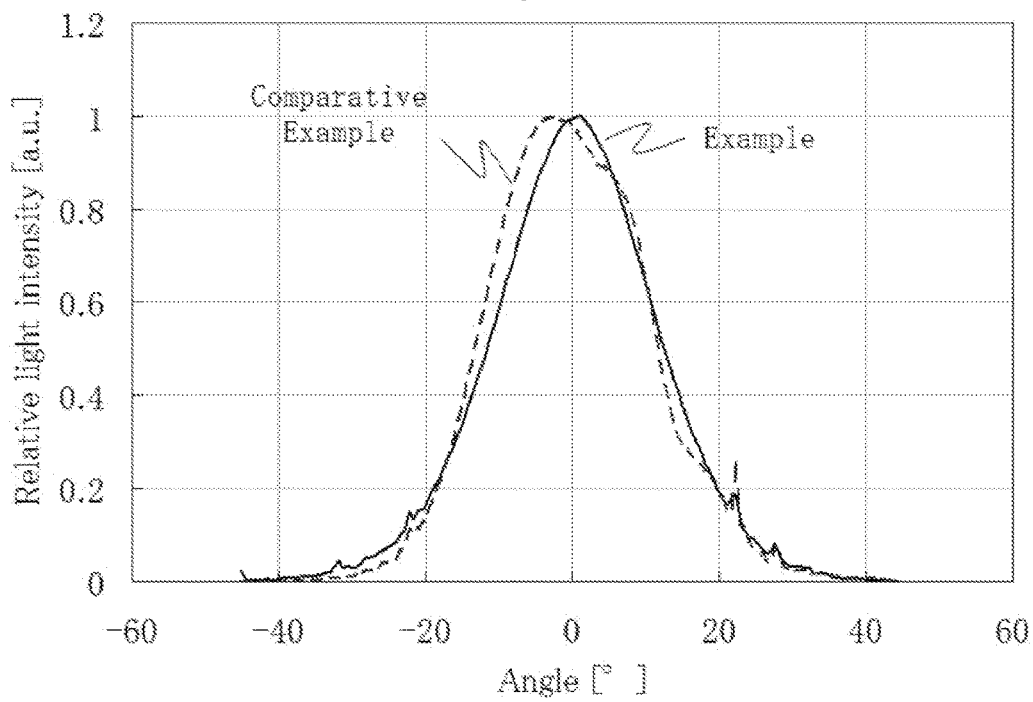
FIG. 4 is a diagram for comparing the FFP shapes obtained in the Example and Comparative Example.
Figure 5:
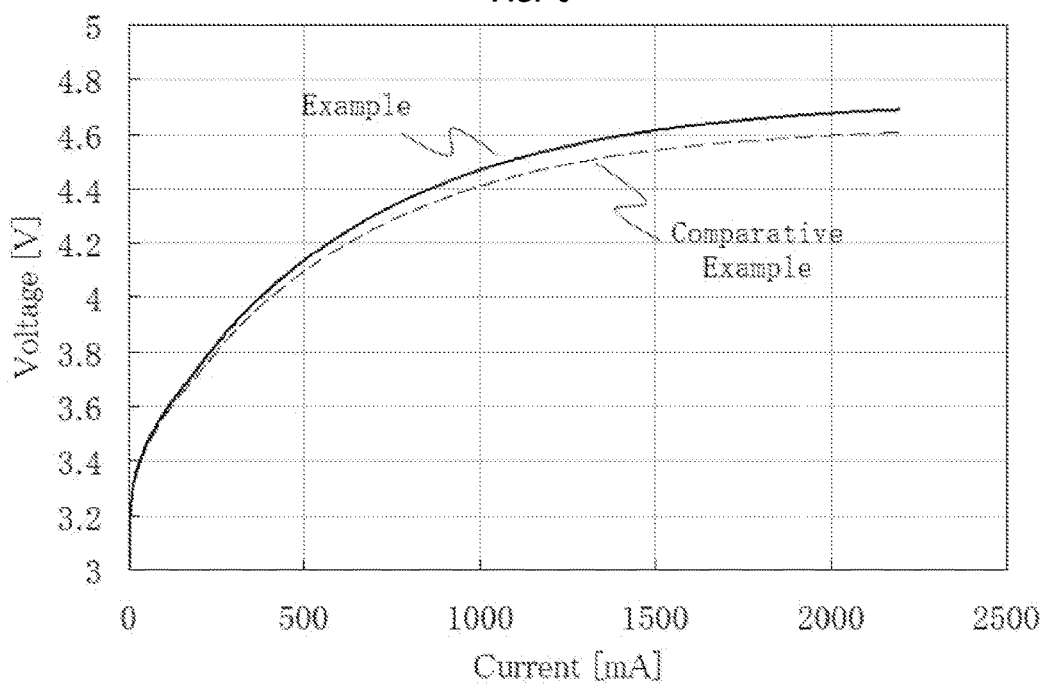
FIG. 5 is a diagram for comparing the I-V characteristics obtained in the Example and Comparative Example.

The shape of the FFP (the FFP shape in a direction perpendicular to the base) of one unit out of 50 units of the semiconductor laser devices fabricated in the Example and one unit out of 50 units of the semiconductor laser devices fabricated in the Comparative Example were respectively observed. FIG. 4 shows a comparison of the FFP shapes obtained in the Example and Comparative Example. Abnormality in the FFP shape was observed in the Comparative Example, but abnormality in the FFP was not observed in the Example. More specifically, in the Comparative Example, the shape of the FFP is warped at an angle of about 7°. This is caused by the laser beam being incident on the surface of the first conductive layer 21. Further, the I (current)-V (voltage) characteristics of the both the Example and Comparative Example were compared, and the result is shown in FIG. 5. From FIG. 5, it is confirmed that the Example showed a higher voltage with respect to a certain amount of current than that in the Comparative Example; that is, the Example has higher heat dissipation property than the Comparative Example. As for the I-V characteristics, the other plurality of semiconductor laser devices obtained in the Example and the other plurality of semiconductor laser devices obtained in the Comparative Example were also measured and similar behavior was observed.

What is claimed is:

1. A method for manufacturing a semiconductor laser device, the method comprising:
   forming a first conducive layer on a base;
   forming a mask on the first conductive layer, the mask including an opening;
   forming a second conductive layer in the opening of the mask,
   forming a third conductive layer in the opening of the mask such that an emitting-side end portion of the third conductive layer is in a common plane with an emitting-side end portion of the second conductive layer, wherein the second and third conductive layers are formed in the opening of the mask such that a thickness of the third conductive layer is less than a thickness of the second conductive layer; and
   disposing a semiconductor laser chip on the third conductive layer such that an emitting-side end portion of the semiconductor laser chip is located outward of the emitting-side end portion of the third conductive layer, wherein, after the semiconductor laser chip is disposed on the third conductive layer, the emitting-side end portion of the third conductive layer remains in a common plane with the emitting-side end portion of the second conductive layer.

2. The method according to claim 1, wherein the semiconductor laser chip includes a substrate and a semiconductor structure disposed on the substrate, and the third conductive layer is connected to the semiconductor laser chip at a semiconductor structure side of the semiconductor laser chip.

3. The method according to claim 1, wherein the second conductive layer has a higher thermal conductivity than that of the base.

4. The method according to claim 1, wherein the base is made of an insulating material.

5. The method according to claim 2, wherein the base is made of an insulating material.

6. The method according to claim 4, wherein the base is made of aluminum nitride.

7. The method according to claim 5, wherein the base is made of aluminum nitride.

8. The method according to claim 1, wherein the first conductive layer has a thickness of 0.5 μm or greater and 1.5 μm or less.

9. The method according to claim 2, wherein the first conductive layer has a thickness of 0.5 μm or greater and 1.5 μm or less.

10. The method according to claim 1, wherein the second conductive layer has a thickness of 4 μm or greater and 20 μm or less.

11. The method according to claim 2, wherein the second conductive layer has a thickness of 4 μm or greater and 20 μm or less.

12. The method according to claim 1, wherein the third conductive layer has a thickness of 2 μm or greater and 5 μm or less.

13. The method according to claim 2, wherein the third conductive layer has a thickness of 2 μm or greater and 5 μm or less.

14. The method according to claim 1, wherein the semiconductor laser chip comprises a GaN substrate and a plurality of semiconductor layers.

15. The method according to claim 2, wherein the semiconductor laser chip comprises a GaN substrate and a plurality of semiconductor layers.

16. The method according to claim 1, wherein the third conductive layer comprises a brazing material.

17. The method according to claim 1, wherein the third conductive layer comprises an AuSn solder.

18. The method according to claim 1, wherein the second conductive layer comprises at least one of gold, copper, and silver.

19. The method according to claim 1, wherein the third conductive layer comprises a brazing material, and the second conductive layer comprises at least one of gold, copper, and silver.

* * * * *